(12) United States Patent
Ferrier

(10) Patent No.: US 7,186,305 B2
(45) Date of Patent: Mar. 6, 2007

(54) PROCESS FOR IMPROVING THE ADHESION OF POLYMERIC MATERIALS TO METAL SURFACES

(76) Inventor: Donald Ferrier, 455 Prospect St., Thomaston, CT (US) 06787

( * ) Notice: Subject to any disclaimer, the term of this patent is extended or adjusted under 35 U.S.C. 154(b) by 373 days.

(21) Appl. No.: 10/304,514

(22) Filed: Nov. 26, 2002

(65) Prior Publication Data

US 2004/0099343 A1 May 27, 2004

(51) Int. Cl.
*C23C 22/73* (2006.01)
*C23C 22/05* (2006.01)
*C23C 22/17* (2006.01)

(52) U.S. Cl. ............... 148/248; 148/251; 148/282; 148/283; 106/14.05; 106/14.15; 106/14.16; 106/14.17; 106/14.41; 106/14.42

(58) Field of Classification Search ........... 148/240, 148/243, 274, 282, 248; 106/14.11, 14.14, 106/14.16, 14.21, 14.44; 252/388; 438/691
See application file for complete search history.

(56) References Cited

U.S. PATENT DOCUMENTS

| | | | |
|---|---|---|---|
| 4,409,037 A | 10/1983 | Landau | |
| 4,642,161 A | 2/1987 | Akahoshi et al. | |
| 4,775,444 A | 10/1988 | Cordani | |
| 4,844,981 A | 7/1989 | Landau | |
| 4,902,551 A | 2/1990 | Nakaso et al. | |
| 4,981,560 A | 1/1991 | Kajihara et al. | |
| 4,997,516 A | 3/1991 | Adler | |
| 4,997,722 A | 3/1991 | Adler | |
| 5,289,630 A | 3/1994 | Ferrier et al. | |
| 5,532,094 A * | 7/1996 | Arimura et al. | 216/106 |
| 5,800,859 A | 9/1998 | Price et al. | |
| 5,869,130 A | 2/1999 | Ferrier | |
| 6,036,758 A * | 3/2000 | Fairweather | 106/14.44 |
| 6,146,701 A * | 11/2000 | Ferrier | 427/327 |
| 6,383,272 B1 | 5/2002 | Ferrier | |
| 6,562,719 B2 * | 5/2003 | Kondo et al. | 438/691 |

FOREIGN PATENT DOCUMENTS

WO  WO 96/19097  6/1996

* cited by examiner

*Primary Examiner*—Roy King
*Assistant Examiner*—Lois Zheng
(74) *Attorney, Agent, or Firm*—Carmody & Torrance LLP

(57) ABSTRACT

A process is described for treating metal surfaces with a composition comprising an oxidizer, an acid, a corrosion inhibitor, an unsaturated alkyl substituted with an aromatic or non-aromatic cyclic groups, and optionally but preferably a source of adhesion enhancing species selected from the group consisting of molybdates, tungstates, tantalates, niobates, vanadates, isopoly or heteropoly acids of molybdenum, tungsten, tantalum, niobium, vanadium, and combinations of any of the foregoing, an organic nitro compound, and a source of halide ions in order to increase the adhesion of polymeric materials to the metal surface.

36 Claims, 1 Drawing Sheet

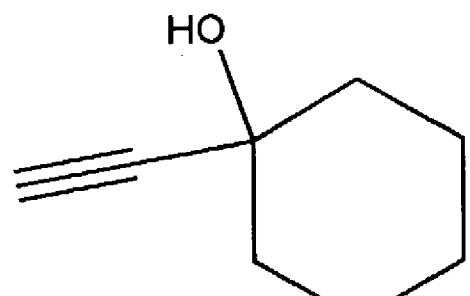
ethynyl cyclohexanol
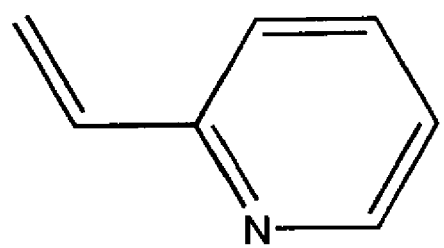
vinyl pyridine
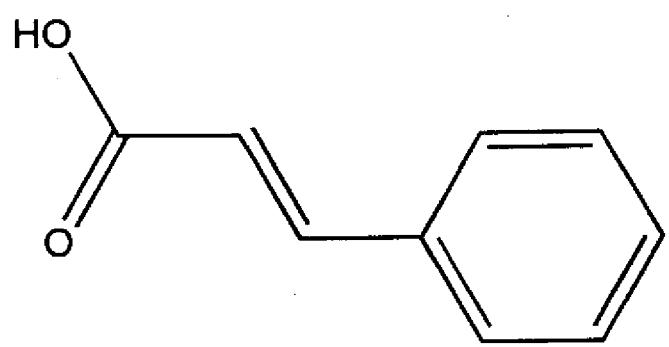
cinnamic acid

PROCESS FOR IMPROVING THE ADHESION OF POLYMERIC MATERIALS TO METAL SURFACES

FIELD OF THE INVENTION

The present invention relates to printed circuits, and more particularly to a process for fabricating a multilayer printed circuit.

BACKGROUND OF THE INVENTION

Printed circuits containing one or more circuitry innerlayers are in prominent use today as demand increases for further and further weight and space conservation in electronic devices.

In the typical fabrication of a multilayer printed circuit, patterned circuitry innerlayers are first prepared by a process in which a copper foil-clad dielectric substrate material is patterned with resist in the positive image of the desired circuitry pattern, followed by etching away of the exposed copper. Upon removal of the resist, there remains the desired copper circuitry pattern.

One or more circuitry innerlayers of any particular type or types of circuitry pattern, as well as circuitry innerlayers which might constitute ground planes and power planes, are assembled into a multilayer circuit by interposing one or more partially-cured dielectric substrate material layers (so-called "pre-preg" layers) between the circuitry innerlayers to form a composite of alternating circuitry inner-layers and dielectric substrate material. The composite is then subjected to heat and pressure to cure the partially-cured substrate material and achieve bonding of circuitry innerlayers thereto. The so-cured composite will then have a number of through-holes drilled therethrough, which are then metallized to provide a means for conductively interconnecting all circuitry layers. In the course of the through-hole metallizing process, desired circuitry patterns also typically will be formed on the outer-facing layers of the multilayer composite.

An alternate approach to the formation of a multilayer printed circuit board is through additive or surface laminer circuitry techniques. These techniques begin with a non-conductive substrate, upon which the circuit elements are additively plated. Further layers are achieved by repeatedly applying an imageable coating upon the circuitry and plating further circuit elements upon the imageable coating.

It has long been known that the strength of the adhesive bond formed between the copper metal of the circuitry innerlayers and the cured pre-preg layers, or other non-conductive coatings, in contact therewith leaves something to be desired, with the result that the cured multilayer composite or the coating is susceptible to delamination in subsequent processing and/or use. In response to this problem, the art developed the technique of forming on the copper surfaces of the circuitry innerlayers (before assembling them with pre-preg layers into a multilayer composite) a layer of copper oxide, such as by chemical oxidation of the copper surfaces. The earliest efforts in this regard (so-called "black oxide" adhesion promoters) produced somewhat minimal improvement in the bonding of the circuitry innerlayers to the dielectric substrate layers in the final multilayer circuit, as compared to that obtained without copper oxide provision. Subsequent variations on the black oxide technique included methods wherein there is first produced a black oxide coating on the copper surface, followed by post-treatment of the black oxide deposit with 15% sulfuric acid to produce a "red oxide" to serve as the adhesion promoter, such as disclosed by A. G. Osborne, "An Alternate Route To Red Oxide For Inner Layers", PC Fab. August, 1984, as well as variations involving direct formation of red oxide adhesion promoter, with varying degrees of success being obtained. The most notable improvement in this art is represented in the U.S. Pat. Nos. 4,409,037 and 4,844,981 to Landau, the teachings both of which are included herein by reference in their entirety, involving oxides formed from relatively high chlorite/relatively low caustic copper oxidizing compositions, and producing substantially improved results in circuitry innerlayer adhesion.

As earlier noted, the assembled and cured multilayer circuit composite is provided with through-holes which then require metallization in order to serve as a means for conductive interconnection of the circuitry layers of the circuit. The metallizing of the through-holes involves steps of resin desmearing of the hole surfaces, catalytic activation, electroless copper depositing, electrolytic copper depositing, and the like. Many of these process steps involve the use of media, such as acids, which are capable of dissolving the copper oxide adhesion promoter coating on the circuitry innerlayer portions exposed at or near the through hole. This localized dissolution of the copper oxide, which is evidenced by formation around the through-hole of a pink ring or halo (owing to the pink color of the underlying copper metal thereby exposed), can in turn lead to localized delamination in the multilayer circuit.

The art is well aware of this "pink ring" phenomenon, and has expended extensive effort in seeking to arrive at a multilayer printed circuit fabrication process which is not susceptible to such localized delamination. One suggested approach has been to provide the adhesion promoting copper oxide as a thick coating so as to retard its dissolution in subsequent processing simply by virtue of sheer volume of copper oxide present. This turns out to be essentially counter-productive, however, because the thicker oxide coating is inherently less effective as an adhesion promoter per se. Other suggestions relating to optimization of the pressing/curing conditions for assembling the multilayer composite have met with only limited success.

Other approaches to this problem involve post-treatment of the copper oxide adhesion promoter coating prior to assembly of circuitry innerlayers and pre-preg layers into a multilayer composite. For example, U.S. Pat. No. 4,775,444 to Cordani discloses a process in which the copper surfaces of the circuitry innerlayers are first provided with a copper oxide coating and then contacted with an aqueous chromic acid solution before the circuitry innerlayers are incorporated into the multilayer assembly. The treatment serves to stabilize and/or protect the copper oxide coating from dissolution in the acidic media encountered in subsequent processing steps (e.g. through-hole metallization), thereby minimizing pink ring/delamination possibilities.

U.S. Pat. No. 4,642,161 to Akahoshi et al, U.S. Pat. No. 4,902,551 to Nakaso et al, and U.S. Pat. No. 4,981,560 to Kajihara et al, and a number of references cited therein, relate to processes in which the copper surfaces of the circuitry innerlayers, prior to incorporation of the circuitry innerlayers into a multilayer circuit assembly, are first treated to provide a surface coating of adhesion-promoting copper oxide. The copper oxide so formed is then reduced to metallic copper using particular reducing agents and conditions. As a consequence, the multilayer assembly employing such circuitry innerlayers will not evidence pink ring formation since there is no copper oxide present for localized dissolution, and localized exposure of underlying copper, in subsequent through-hole processing. As with other techniques, however, processes of this type are suspect in terms of the adhesion attainable between the dielectric substrate layers and the metallic copper circuitry innerlayers. This is particularly so in these reduction processes since the circuitry bonding surface not only is metallic copper, but also presents the metallic copper in distinct phases (i.e., (1) copper-from-reduction-of-copper oxide over (2) copper of the copper foil) which are prone to separation/delamination along the phase boundary.

U.S. Pat. Nos. 4,997,722 and 4,997,516 to Adler similarly involve formation of a copper oxide coating on the copper surfaces of circuitry innerlayers, followed by treatment with a specialized reducing solution to reduce the copper oxide to metallic copper. Certain portions of the copper oxide apparently may not be reduced all the way to metallic copper (being reduced instead to hydrous cuprous oxide or cuprous hydroxide), and those species are thereafter dissolved away in a non-oxidizing acid which does not attack or dissolve the portions already reduced to metallic copper. As such, the multi-layer assembly employing such circuitry innerlayers will not evidence pink ring formation since there is no copper oxide present for localized dissolution, and localized exposure of underlying copper, in subsequent through-hole processing. Here again, however, problems can arise in terms of the adhesion between the dielectric layers and metallic copper circuitry innerlayers, firstly because the bonding surface is metallic copper, and secondly because the metallic copper predominately is present in distinct phases (i.e., (1) copper-from-reduction-of-copper oxide over (2) copper of the copper foil), a situation prone to separation/delamination along the phase boundary.

U.S. Pat. No. 5,289,630 to Ferrier et al., the teachings of which are incorporated herein by reference in their entirety, reveals a process whereby an adhesion promoting layer of copper oxide is formed on the circuit elements followed by a controlled dissolution and removal of a substantial amount of the copper oxide in a manner which does not adversely affect the topography.

Another approach to this problem uses a sulfuric acid/hydrogen peroxide based etching solution containing benzotriazole and other organic or inorganic components to create an organometallic film on the metal surface. This film is then involved in bonding to the polymeric material during a high temperature/pressure step. However, these baths generally have high concentrations of benzotriazole and etch significant amount of copper (60–100 microinches or more) during the film formation. Formulations to reduce the amount of copper etched would be beneficial both from the standpoint of manufacturing high performance circuit boards and generating significantly lower amounts of waste than the standard processes now in use.

The inventor has discovered that baths containing lower levels of benzotriazole and etching much less copper can be formulated by using unsaturated alkyls substituted with aromatic or non-aromatic cyclic groups in conjunction with relatively low levels of benzotriazole and other components.

PCT Application No. WO 96/19097 to McGrath (and related U.S. Pat. No. 5,800,859), discusses a process for improving the adhesion of polymeric materials to a metal surface. The process discussed involves contacting the metal surface with an adhesion-promoting composition comprising hydrogen peroxide, an inorganic acid, a corrosion-inhibitor and a quaternary ammonium surfactant.

U.S. Pat. No. 5,869,130 issued to Ferrier discloses a process for treating metal surfaces with a composition comprising an oxidizer, an acid, a corrosion inhibitor, a source of halide ions and optionally a water soluble polymer in order to increase the adhesion of polymeric materials to the metal surface.

U.S. Pat. No. 6,383,272 issued to Ferrier discloses a process for treating metal surfaces with a composition comprising an oxidizer, an acid, a corrosion inhibitor, a benzotriazole with an electron withdrawing group in the 1-position which electron withdrawing group is a stronger electron withdrawer than a hydrogen group, an adhesion enhancing species, which species are selected from the group consisting of molybdates, tungstates, tantalates, niobates, vanadates, isopoly or heteropoly acids of molybdenum, tungsten, tantalum, niobium, vanadium, and combinations of any of the foregoing, a water soluble polymer; and a source of halide ions.

This invention proposes a process for improving the adhesion of polymeric materials to a metal surface, especially copper or copper alloy surfaces. The process proposed herein is particularly useful in the production of multilayer printed circuits. The process proposed herein provides optimum adhesion between the metallic and polymeric surfaces (ie. the circuitry and the intermediate insulating layer), eliminates or minimizes pink ring and operates economically, all as compared to conventional processes. In addition, the process proposed herein significantly reduces the amount of copper etched during formation of the adhesion-promoting film, resulting in the manufacture of high performance circuit boards and generating less waste than standard processes now in use.

SUMMARY OF THE INVENTION

The inventor herein proposes a process for improving the adhesion of polymeric materials to metal surfaces, particularly copper and copper alloy surfaces. The proposed process comprises:

1) Contacting the metal surface with an adhesion-promoting composition comprising:
   a) an oxidizer;
   b) an acid;
   c) a corrosion inhibitor;
   d) an unsaturated alkyl substituted with aromatic or non-aromatic cyclic groups;
   e) optionally, an organic nitro compound, preferably an aromatic nitro compound and most preferably an organic nitro compound selected from the group consisting of sodium meta-nitrobenzenesulfonate, paranitrophenol, 3,5-dinitrosalicylic acid and 3,5-dinitrobenzoic acid;
   f) optionally, a source of adhesion enhancing species, which species are selected from the group consisting of molybdates, tungstates, tantalates, niobates, vanadates, isopoly or heteropoly acids of molybdenum, tungsten, tantalum, niobium, vanadium, and combinations of any of the foregoing; and
   g) optionally, a source of halide ions;
2) thereafter bonding the polymeric material to the metal surface.

The inventor has found that the foregoing process improves the adhesion of metal surfaces to the polymeric materials, particularly when the metal surfaces comprise copper or copper alloys. The inventor has also found that the foregoing process significantly reduces the amount of copper etched during film formation as compared to prior art adhesion-promoting compositions. The process proposed is particularly suited to the production of multilayer printed circuit boards.

DETAILED DESCRIPTION OF THE INVENTION

The inventor herein has found that the adhesion between a metal surface and a polymeric material is enhanced by contacting the metal surface with an adhesion-promoting composition prior to bonding the polymeric material to the metal surface. The invention therefore proposes a process for increasing the adhesion of a polymeric material to a metal surface, said process comprising:

1) contacting the metal surface with an adhesion-promoting composition comprising:
   a) an oxidizer;
   b) an acid;
   c) a corrosion inhibitor;
   d) an unsaturated alkyl substituted with aromatic or non-aromatic cyclic groups;
   e) optionally, an organic nitro compound, preferably an aromatic nitro compound and most preferably an organic nitro compound selected from the group consisting of sodium meta-nitrobenzenesulfonate, para-nitrophenol, 3,5-dinitrosalicylic acid and 3,5-dinitrobenzoic acid;
   f) optionally, adhesion enhancing species, which species are selected from the group consisting of molybdates, tungstates, tantalates, niobates, vanadates, isopoly or heteropoly acids of molybdenum, tungsten, tantalum, niobium, vanadium, and combinations of any of the foregoing; and
   g) optionally, a source of halide ions;
2) thereafter bonding the polymeric material to the metal surface.

The inventors has found that the proposed adhesion-promoting composition produces a roughened coated surface upon the metal. The surface produced is particularly suited to bonding with polymeric materials in that significantly increased adhesion values are achieved as compared to a non-treated metal surface. In addition the coated (treated) metal surface maintains the increased adhesion over time and decreases the likelihood of any unwanted reactions occurring over time between the metal and the polymeric material. The proposed adhesion-promoting composition also reduces the amount of copper etched during film formation as compared to conventional adhesion-promoting compositions.

The process proposed is particularly suited to the manufacture of multilayer printed circuit boards. Thus, in this application, the metal circuitry (usually copper) of the innerlayers is treated with the adhesion-promoting composition proposed herein. After treatment, followed by water rinsing, the innerlayers are bonded together with polymeric materials such as pre-pregs or imageable dielectrics, resulting in the multilayer printed circuit board.

The metal surface to be treated may comprise a variety of metals such as copper, copper alloys, nickel and iron. However, the process of the invention produces the best results when the metal surfaces comprise copper or copper alloys. The polymeric material may be a variety of polymeric materials including pre-preg materials, imageable dielectrics, photoimageable resins, soldermasks, adhesives or polymeric etch resists.

The oxidizer used in the adhesion-promoting composition may comprise any oxidizer, which is capable of oxidizing the metal surface in the matrix of the adhesion-promoting composition. The inventors have found hydrogen peroxide and persulfates to be particularly preferred oxidizers for use in the process of the invention, with hydrogen peroxide being the most preferred oxidizer. The concentration of the oxidizer in the adhesion-promoting composition may range from 2 to 60 grams per liter but is preferably from 3 to 30 grams per liter.

The acid utilized in the adhesion-promoting composition may be any acid which is stable in the matrix, however, the inventors have found mineral acids to be particularly preferred. Sulfuric acid is especially preferred. The concentration of the acid in the adhesion-promoting composition may range from 5 to 360 grams per liter but is preferably from 20 to 110 grams per liter.

The corrosion inhibitor used in the adhesion-promoting composition is a compound which effectively reacts with the metal surface to form a protective complex layer. Preferred corrosion inhibitors are selected from the group consisting of triazoles, benzotriazoles, tetrazoles, imidazoles, benzimidazoles and mixtures of the foregoing. Benzotriazoles are particularly preferred. The concentration of the corrosion inhibitor in the adhesion-promoting composition may range from 0.1 to 20 grams per liter but is preferably from 0.5 to 12 grams per liter, and is most preferably from 1 to 2 grams per liter.

The inventor has found that the inclusion of organic nitro compounds, preferably aromatic nitro compounds, in the adhesion promoting composition yields a composition which will react with a metallic surface, particularly copper or copper alloys, to give a uniform conversion coated metallic surface which bonds well to polymeric materials, while etching the metal surface at relatively low rates. Low metal etch rates are advantageous for at least three reasons. First, a low etch rate removes less metal from the surface thereby leaving more of the original metal cross section in tact. The foregoing is particularly important for circuit traces with impedance or resistance tolerances which must be maintained since these properties are directly related to the cross sectional area of the circuit. Second, low metal etch rates allow the opportunity for reworking defective parts. Lastly, low metal etch rates reduce the rate at which metal builds up in the adhesion promoting composition. Since metal build up in the adhesion promoting composition has an effect upon the ultimate useable life of the composition, lower etch rates lead to an extended useable life for the adhesion promoting solutions in terms of the maximum square feet of metal processable per gallon of adhesion promoting composition.

The organic nitro compounds useable in the adhesion promoting composition of this invention are preferably aromatic nitro compounds. Some examples of particularly useful organic nitro compounds are sodium meta-nitrobenzenesulfonate, para-nitrophenol, 3,5-dinitrosalicylic acid, and 3,5-dinitrobenzoic acid. The concentration of the organic nitro compound in the adhesion promoting composition, if used, may range from 0.05 to 25 grams per liter, but is preferably from 0.1 to 10 grams per liter and is most preferably from 0.2 to 2 grams per liter.

The source of adhesion enhancing species can be any material which will supply species selected from the group consisting of molybdates, tungstates, tantalates, niobates, vanadates and mixtures thereof to the adhesion promoting composition. Such sources include alkali metal salts of molybdates, tungstate, tantalates, niobates, vanadates and mixtures thereof such as sodium (or potassium) molybdate, tungstate, niobate or vanadate, and heteropoly acids or isopoly acids of molybdenum, tungsten, tantalum, niobium or vanadium. Thus, molybdates or tungstates which include hetero atoms such as phosphorous, silicon, cobalt, manganese and tungsten are suitable. Preferred sources include iso and hetero polyacids of molybdenum, tungsten, niobium, vanadium and mixtures thereof such as molybdic acid, vanadic acid and tungstic acid. The most preferred source of adhesion enhancing species is molybdic acid. The concentration of adhesion enhancing species in the adhesion promoting composition, if used, may range from 1 mg/l to 500 mg/l (based on the adhesion enhancing ion content) but is preferably from 5 mg/l to 200 mg/l.

The adhesion-promoting composition also preferably contains a source of halide ions, which are compounds that provide halide ions in the matrix of the adhesion-promoting composition. Preferably, the source of halide ions are alkaline metal salts such as sodium chloride or potassium chloride, oxohalides such as sodium chlorate or potassium chlorate, or halide bearing mineral acids such as hydrochloric acid. Preferably the source of halide ions provides chloride ions to the adhesion-promoting composition and most preferably the source of halide ions provides chlorate ions to the adhesion-promoting composition. The concentration of the source of halide ions in the adhesion promoting composition, if used, may range from 5 to 500 milligrams per liter but is preferably from 10 to 50 milligrams per liter, all based on halide ion content.

The adhesion-promoting composition also contains an unsaturated alkyl substituted with aromatic or non-aromatic cyclic groups. Suitable unsaturated alkyl compounds include cinnamic acid, ethynyl cyclohexanol, and 2-vinylpyridine. The concentration of the unsaturated alkyl compound may range from 0 to 25 grams per liter, but is preferably from 0.1 to 2 grams per liter.

Thus, the adhesion-promoting composition should contain an acid, an oxidizer, a corrosion inhibitor, an unsaturated alkyl substituted with aromatic or non-aromatic cyclic groups and preferably one or more materials selected from the group consisting of (i) sources of halide ions, (ii) sources of adhesion enhancing species, and (iii) sources of organic nitro compounds.

The metal surface can be treated with the adhesion-promoting composition in a variety of ways, including immersion, spray, or flood. The temperature of the adhesion-promoting composition during treatment may range from 80° F. to 150° F. but is preferably from 90° F. to 120° F. The treatment time will vary depending upon the temperature and method of treatment but may range from 15 seconds to 15 minutes and is preferably from 1 to 2 minutes.

The following examples are illustrative of the invention but should not be taken as limiting:

The following cycle was used in processing the copper clad panels and copper foils in all of the following examples:

|  | Time |
| --- | --- |
| Acid Preclean, Room Temperature | 10 seconds |
| Cold Water Rinse | 20 seconds |
| Alkaline Cleaner, 130° F. | 2 minutes |
| Cold Water Rinse | 2 minutes |
| *Predip, Room Temperature | 1 minute |
| Test Solution, 100° F. | 1 minute |
| Cold Water Rinse | 1 minute |
| Forced Air Dry | 1 minute |

*The predip used consisted of 2 grams per liter benzotriazole in water at a pH of approximately 10.

For each example, copper foils and panels were processed through the standard cycle noted above with the specified Example Bath.

EXAMPLE 1

An Example Bath of the following composition was made up:
4.5% by volume concentrated sulfuric acid
1.2 grams/liter benzotriazole
0.7 g/l 3,5-dinitrosalicylic acid
0.15 g/l cinnamic acid
15 mg/l sodium chloride
10 mg/l molybdic acid
1.1% by volume of 50% hydrogen peroxide A copper surface processed through this bath yielded a uniform brown surface. Approximately 25 μin of copper were removed during processing.

EXAMPLE 2

An Example Bath of the following composition was made up:
2.0% by volume concentrated sulfuric acid
1.2 grams/liter benzotriazole
0.4 g/l 3,5-dinitrosalicylic acid
0.1 g/l cinnamic acid
15 mg/l sodium chloride
10 mg/l molybdic acid
1.2% by volume of 50% hydrogen peroxide A copper surface processed through this bath yielded a uniform purple/brown surface. Approximately 23 μin of copper were removed during processing.

EXAMPLE 3

An Example Bath of the following composition was made up:
5.0% by volume concentrated sulfuric acid
1.2 grams/liter benzotriazole
0.6 g/l 3,5-dinitrosalicylic acid
0.8 g/l ethynyl cyclohexanol
15 mg/l sodium chloride
10 mg/l molybdic acid
1.1% by volume of 50% hydrogen peroxide A copper surface processed through this bath yielded a slightly nonuniform purple surface. Approximately 25 μin of copper were removed during processing.

EXAMPLE 4

An Example Bath of the following composition was made up:
5.0% by volume concentrated sulfuric acid
1.2 grams/liter benzotriazole
0.6 g/l 3,5-dinitrosalicylic acid
1.1 g/l 2-vinylpyridine
15 mg/l sodium chloride
10 mg/l molybdic acid
1.1% by volume 50% hydrogen peroxide A copper surface processed through this bath yielded a slightly nonuniform purple surface. Approximately 29 μin of copper were removed during processing.

Comparative Example 1

An Example Bath of the following composition was made up:
2.0% by volume concentrated sulfuric acid
1.2 grams/liter benzotriazole
0.4 g/l 3,5-dinitrosalicylic acid 15 mg/l sodium chloride
10 mg/l molybdic acid
1.1% by volume 50% hydrogen peroxide A copper surface processed through this bath yielded a uniform dark pink surface. Approximately 20 µin of copper were removed during processing.

Comparative Example 2

An Example Bath of the following composition was made up:

4.5% by volume concentrated sulfuric acid
1.2 grams/liter benzotriazole
0.6 g/l 3,5-dinitrosalicylic acid
15 mg/l sodium chloride
10 mg/l molybdic acid
1.1% by volume 50% hydrogen peroxide A copper surface processed through this bath yielded a nonuniform very dark pink surface. Approximately 28 µin of copper were removed during processing.

After processing, the panels and foils were baked for 30 minutes at 230° F., then laminated at 350° F. and 200 pounds per square inch pressure for 45 minutes with NELCO N4205-2 glass/epoxy resin (available from the NELCO Company) to give test panels. The stripped panels were baked for 2 hours at 230° F., then immersed in molten tin/lead solder at 550° F. for zero, thirty, and sixty seconds, and the strength of bonding between the copper foil and the glass/epoxy resin was measured. The strength of the copper to resin bond was measured by peeling the foil strips from the resin and the results are presented in Table I below.

TABLE I

Strength of Bonding Between Copper Foil and Glass/Epoxy Resin

| Example | 0 Seconds | 30 Seconds | 60 Seconds | Color Change |
| --- | --- | --- | --- | --- |
| 1 | 7.8 lb/in | 6.2 lb/in | 4.8 lb/in | Slight |
| 2 | 7.5 lb/in | 6.2 lb/in | 4.8 lb/in | Slight |
| 3 | 6.8 lb/in | 6.8 lb/in | 4.8 lb/in | Slight |
| 4 | 5.8 lb/in | 5.8 lb/in | 4.5 lb/in | Very Slight |
| Comparative 1 | 7.2 lb/in | 5.8 lb/in | 4.5 lb/in | Slight |
| Comparative 2 | 7.0 lb/in | 5.0 lb/in | 2.8 lb/in | Yes |

It is clear from the examples that the addition of unsaturated alkyls with cyclic aromatic or non-aromatic substituents to adhesion promoting compositions used in bonding preparation gives improved cosmetic appearance and acceptable adhesion of polymeric materials on treated copper surfaces as compared to microetches of similar compositions in the absence of these materials.

What is claimed is:

1. A process for increasing the adhesion of a polymeric material to a metal surface, wherein the metal surface comprises copper, said process comprising:
   a) contacting the metal surface with an adhesion-promoting composition comprising:
      1) hydrogen peroxide;
      2) an inorganic acid;
      3) a corrosion inhibitor;
      4) an unsaturated alkyl substituted with aromatic or non-aromatic cyclic groups; and
      5) optionally, but preferably, at least one material selected from the group consisting of:
         (i) sources of halide ions;
         (ii) organic nitro compounds;
         (iii) sources of adhesion enhancing species, which species are selected from the group consisting of molybdates, tungstates, tantalates, niobates, vanadates, isopoly or heteropoly acids of molybdenum, tungsten, tantalum, niobium, vanadium, and combinations of any of the foregoing; and
   b) bonding the polymeric material to the metal surface.

2. A process according to claim 1 wherein the corrosion inhibitor is selected from the group consisting of triazoles, benzotriazoles, imidazoles, benzimidazoles, tetrazoles and mixtures of the foregoing.

3. A process according to claim 2 wherein the corrosion inhibitor is benzotriazole.

4. A process according to claim 3 wherein the concentration of benzotriazole is from 1to 2grams per liter.

5. A process according to claim 1 wherein the adhesion enhancing species is present and comprises molybdate ions.

6. A process according to claim 1 wherein the concentration of the hydrogen peroxide is from 3 to 30 grams per liter.

7. A process according to claim 1 wherein the concentration of the inorganic acid is from 20 to 110 grams per liter.

8. A process according to claim 1 wherein the unsaturated alkyl is selected from the group consisting of cinnamic acid, ethynyl cyclohexanol, and 2-vinylpyridine.

9. A composition useful in treating metal surfaces prior to bonding polymeric materials to the metal surfaces, said composition comprising:
   a) hydrogen peroxide;
   b) an inorganic acid;
   c) a corrosion inhibitor;
   d) an unsaturated alkyl substituted with aromatic or non-aromatic cyclic groups; and
   e) optionally, but preferably, at least one material selected from the group consisting of:
      (i) sources of halide ions;
      (ii) organic nitro compounds;
      (iii) sources of adhesion enhancing species, which species are selected from the group consisting of molybdates, tungstates, tantalates, niobates, vanadates, isopoly or heteropoly acids of molybdenum, tungsten, tantalum, niobium, vanadium, and combinations of any of the foregoing.

10. A composition according to claim 9 wherein the concentration of the hydrogen peroxide is from 3 to 30 grams per liter.

11. A composition according to claim 9 wherein the adhesion enhancing species is present and comprises molybdate ions.

12. A composition according to claim 9 wherein the corrosion inhibitor is selected from the group consisting of triazoles, benzotriazoles, imidazoles, tetrazoles, benzimidazoles, and mixtures of the foregoing.

13. A composition according to claim 12 wherein the corrosion inhibitor is benzotriazole.

14. A composition according to claim 13 wherein the concentration of benzotriazole is from 1 to 2 grams per liter.

15. A composition according to claim 9 wherein the unsaturated alkyl is selected from the group consisting of cinnamic acid, ethynyl cyclohexanol, and 2-vinylpyridine.

16. A process for increasing the adhesion of a polymeric material to a metal surface, which metal surface comprises copper, said process comprising:
   a) contacting the metal surface with an adhesion-promoting composition comprising:
      1) 2 to 60 grams per liter of hydrogen peroxide;
      2) 5 to 360 grams per liter of an inorganic acid;
      3) 0.1 to 20 grams per liter of benzotriazole;

4) an unsaturated alkyl substituted with aromatic or non-aromatic cyclic groups; and
    5) optionally, but preferably, at least one material selected from the group consisting of:
        (i) sources of halide ions;
        (ii) organic nitro compounds;
        (iii) sources of adhesion enhancing species, which species are selected from the group consisting of molybdates, tungstates, tantalates, niobates, vanadates, isopoly or heteropoly acids of molybdenum, tungsten, tantalum, niobium, vanadium, and combinations of any of the foregoing; and
    b) bonding the polymeric material to the metal surface.

17. A process according to claim 16 wherein the concentration of hydrogen peroxide is from 3 to 30 grams per liter.

18. A process according to claim 16 wherein the adhesion enhancing species is present and comprises molybdate ions.

19. A process according to claim 16 wherein the concentration of benzotriazole is from 1 to 2 grams per liter.

20. A process according to claim 16 wherein the unsaturated alkyl is selected from the group consisting of cinnamic acid, ethynyl cyclohexanol, and 2-vinylpyridine.

21. A composition useful in treating metal surfaces which metal surfaces comprise copper, prior to bonding polymeric materials to the metal surface, said composition comprising:
    a) 2 to 60 grams per liter of hydrogen peroxide;
    b) 5 to 360 grams per liter of an inorganic acid;
    c) 0.1 to 20 grams per liter of benzotriazole;
    d) an unsaturated alkyl substituted with aromatic or non-aromatic cyclic groups; and
    e) optionally, but preferably, at least one material selected from the group consisting of:
        (i) sources of halide ions;
        (ii) organic nitro compounds;
        (iii) sources of adhesion enhancing species, which species are selected from the group consisting of molybdates, tungstates, tantalates, niobates, vanadates, isopoly or heteropoly acids of molybdenum, tungsten, tantalum, niobium, vanadium, and combinations of any of the foregoing.

22. A composition according to claim 21 wherein the concentration of benzothiazole is from 1 to 2 grams per liter.

23. A composition according to claim 21 wherein the adhesion enhancing species is present and comprises molybdate ions.

24. A composition according to claim 21 wherein the concentration of hydrogen peroxide is from 3 to 30 grams per liter.

25. A composition according to claim 21 wherein the concentration of the inorganic acid is from 20 to 110 grams per liter.

26. A composition according to claim 21 wherein the unsaturated alkyl is selected from the group consisting of cinnamic acid, ethynyl cyclohexanol, and 2-vinylpyridine.

27. A process for increasing the adhesion of a polymeric material to a metal surface, wherein the metal surface comprises copper, said process comprising:
    a) contacting the metal surface with an adhesion-promoting composition comprising:
        1) an oxidizer;
        2) an inorganic acid;
        3) a corrosion inhibitor;
        4) an unsaturated alkyl substituted with aromatic or non-aromatic cyclic groups; and
        5) an organic nitro compound; and
        6) optionally, but preferably, at least one material selected from the group consisting of:
            (i) sources of halide ions; and
            (ii) sources of adhesion enhancing species, which species are selected from the group consisting of molybdates, tungstates, tantalates, niobates, vanadates, isopoly or heteropoly acids of molybdenum, tungsten, tantalum, niobium, vanadium, and combinations of any of the foregoing; and
    b) bonding the polymeric material to the metal surface.

28. A process according to claim 27 wherein the corrosion inhibitor is selected from the group consisting of triazoles, benzotriazoles, imidazoles, benzimidazoles, tetrazoles and mixtures of the foregoing.

29. A process according to claim 28 wherein the corrosion inhibitor is benzotriazole.

30. A process according to claim 27 wherein the adhesion enhancing species is present and comprises molybdates.

31. A process according to claim 27 wherein the organic nitro compound is selected from the group consisting of sodium meta-nitrobenzenesulfonate, paranitrophenol, 3,5-dinitrosalicylic acid, and 3,5-dinitrobenzoic acid.

32. A composition useful in treating metal surfaces prior to bonding polymeric materials to the metal surfaces, said composition comprising:
    a) an oxidizer;
    b) an inorganic acid;
    c) a corrosion inhibitor,
    d) an unsaturated alkyl substituted with aromatic or non-aromatic cyclic groups;
    e) an organic nitro compound; and
    e) optionally, but preferably, at least one material selected from the group consisting of:
        (i) sources of halide ions; and
        (ii) sources of adhesion enhancing species, which species are selected from the group consisting of molybdates, tungstates, tantalates, niobates, vanadates, isopoly or heteropoly acids of molybdenum, tungsten, tantalum, niobium, vanadium, and combinations of any of the foregoing.

33. A composition according to claim 32 wherein the adhesion enhancing species is present and comprises molybdate ions.

34. A composition according to claim 32 wherein the corrosion inhibitor is selected from the group consisting of triazoles, benzotriazoles, imidazoles, tetrazoles, benzimidazoles, and mixtures of the foregoing.

35. A composition according to claim 34 wherein the corrosion inhibitor is benzotriazole.

36. A composition according to claim 32 wherein the organic nitro compound is selected from the group consisting of sodium meta-nitrobenzenesulfonate, paranitrophenol, 3,5-dinitrosalicylic acid, and 35-dinitrobenzoic acid.

* * * * *

UNITED STATES PATENT AND TRADEMARK OFFICE
CERTIFICATE OF CORRECTION

| | | |
|---|---|---|
| PATENT NO. | : 7,186,305 B2 | Page 1 of 1 |
| APPLICATION NO. | : 10/304514 | |
| DATED | : March 6, 2007 | |
| INVENTOR(S) | : Donald Ferrier | |

It is certified that error appears in the above-identified patent and that said Letters Patent is hereby corrected as shown below:

Title page after item 57

Delete "36 Claims, 1 Drawing Sheet" and replace it with --36 Claims, 0 Drawing Sheet--

Delete the drawing sheet which appears after the cover sheet.

Column 4

Line 15, delete "1to 2grams per liter" and replace it with --1 to 2 grams per liter--

Column 12

Line 23, delete "molybdates" and replace it with --molybdate ions--
Line 58, delete "35-dinitrobenzoic acid" and replace it with --3,5-dinitrobenzoic acid--

Signed and Sealed this

First Day of May, 2007

JON W. DUDAS
*Director of the United States Patent and Trademark Office*